(12) United States Patent
Hakata et al.

(10) Patent No.: US 8,922,101 B2
(45) Date of Patent: Dec. 30, 2014

(54) LIGHT-EMITTING DEVICE

(71) Applicants: Sanyo Electric Co., Ltd., Moriguchi (JP); Ushio Denki Kabushiki Kaisha, Tokyo (JP)

(72) Inventors: Kunihiko Hakata, Tottori (JP); Tomomi Matsuoka, Kanzaki-gun (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 106 days.

(21) Appl. No.: 13/714,647

(22) Filed: Dec. 14, 2012

(65) Prior Publication Data

US 2013/0099271 A1     Apr. 25, 2013

Related U.S. Application Data

(63) Continuation of application No. 12/352,721, filed on Jan. 13, 2009, now Pat. No. 8,400,051.

(30) Foreign Application Priority Data

Jan. 18, 2008 (JP) ................. 2008-008899

(51) Int. Cl.
| | |
|---|---|
| *H01J 5/16* | (2006.01) |
| *H01J 61/40* | (2006.01) |
| *H01K 1/26* | (2006.01) |
| *H01K 1/30* | (2006.01) |
| *H01L 33/52* | (2010.01) |
| *H01L 25/075* | (2006.01) |
| *F21K 99/00* | (2010.01) |
| *F21Y 101/02* | (2006.01) |
| *H01L 33/54* | (2010.01) |
| *H01L 33/56* | (2010.01) |
| *F21Y 111/00* | (2006.01) |

(52) U.S. Cl.
CPC ............ *H01L 33/52* (2013.01); *H01L 25/0753* (2013.01); *F21K 9/135* (2013.01); *F21Y 2101/02* (2013.01); *H01L 33/54* (2013.01); *H01L 33/56* (2013.01); *H01L 2224/48091* (2013.01); *H01L 2224/48247* (2013.01); *F21Y 2111/001* (2013.01); *H01L 2924/3025* (2013.01)
USPC .................. 313/110; 313/318.02; 313/318.05; 313/503; 313/504; 313/512

(58) Field of Classification Search
USPC ......... 313/110, 318.02, 318.05, 503, 504, 512
See application file for complete search history.

(56) References Cited

U.S. PATENT DOCUMENTS

| | | | | |
|---|---|---|---|---|
| 6,396,082 | B1 * | 5/2002 | Fukasawa et al. | 257/79 |
| 7,521,782 | B2 * | 4/2009 | Ishii | 257/680 |

(Continued)

FOREIGN PATENT DOCUMENTS

| | | |
|---|---|---|
| JP | 61-82659 A | 4/1986 |
| JP | 11-288687 A | 10/1999 |

(Continued)

OTHER PUBLICATIONS

Japanese OA issued on Sep. 30, 2014.

*Primary Examiner* — Thomas A Hollweg
(74) *Attorney, Agent, or Firm* — Marvin A. Motsenbocker; Mots Law, PLLC

(57) ABSTRACT

A light-emitting device is provided that can extract light in all directions and that has wide directivity. This light-emitting device includes: an elongated bar-shaped package extending sideways, the package being formed such that a plurality of leads are formed integrally with a first resin with part of the leads exposed; a light-emitting element that is fixed onto at least one of the leads and that is electrically connected to at least one of the leads; and a second resin sealing the light-emitting element. In the light-emitting device, the first resin and the second resin are formed of optically transparent resin, and the leads have outer lead portions used for external connection and protruding sideways from both left and right ends of the package.

10 Claims, 5 Drawing Sheets

(56) References Cited

U.S. PATENT DOCUMENTS

| | | | |
|---|---|---|---|
| 8,366,295 B2* | 2/2013 | Tanda et al. | 362/249.02 |
| 2002/0006040 A1 | 1/2002 | Kamada et al. | |
| 2003/0132701 A1 | 7/2003 | Sato et al. | |
| 2005/0227393 A1 | 10/2005 | Sato et al. | |
| 2006/0193121 A1 | 8/2006 | Kamoshita | |
| 2006/0267036 A1* | 11/2006 | Lee et al. | 257/98 |
| 2006/0267040 A1 | 11/2006 | Baek et al. | |
| 2007/0139949 A1* | 6/2007 | Tanda et al. | 362/551 |
| 2008/0080181 A1* | 4/2008 | Yu et al. | 362/249 |

FOREIGN PATENT DOCUMENTS

| | | |
|---|---|---|
| JP | 2000-048602 A | 2/2000 |
| JP | 3075689 U | 12/2000 |
| JP | 2003-224305 A | 8/2003 |
| JP | 2004-186488 A | 7/2004 |
| JP | 2005-086051 A | 3/2005 |
| JP | 2005-100800 A | 4/2005 |
| JP | 2006-041379 A | 2/2006 |
| JP | 2006-278924 A | 10/2006 |
| JP | 2007-311626 A | 11/2007 |

* cited by examiner

LIGHT-EMITTING DEVICE

CROSS REFERENCE TO RELATED APPLICATION

This application is a continuation of U.S. patent application Ser. No. 12/352,721, filed on Jan. 13, 2009, which is based upon and claims the benefit of priority from the prior Japanese Patent Application No. 2008-008899, filed on Jan. 18, 2008, the entire contents of which is incorporated herein by reference.

BACKGROUND OF THE INVENTION

1. Field of the Invention

The present invention relates to a light-emitting device and a lighting apparatus incorporating such a light-emitting device, and more particularly to a light-emitting device provided with a light-emitting element and a lighting apparatus incorporating such a light-emitting device.

2. Description of Related Art

In JP-A-2003-168824, there is disclosed a structure in which a light-emitting element and a resin for sealing the light-emitting element are provided in the reflective frame of a package. A lead frame is employed as the package, and the reflective frame is formed of white resin. Since the structure includes the reflective frame as described above, light emitted from the light-emitting element is extracted with increased directivity in one direction.

In JP-T-2003-519929, there is disclosed a structure in which a light-emitting element is sealed with a resin containing fluorescent material without the use of a reflective frame.

The structure of the reflective frame disclosed in JP-A-2003-168824 is not suitable to diffuse light in all directions. In the structure disclosed in JP-T-2003-519929 and having no reflective frame, since a sealing resin is molded at one time, it is difficult to design the detailed shape of the resin. In particular, when a fluorescent material or a light diffusing material is contained in the resin, it is difficult to place the contained material in an optimum position due to the relationship between the specific gravities of the resin and the contained material. In the structures disclosed in JP-A-2003-168824 and JP-T-2003-519929, both their overall shapes are substantially box-shaped; the structures are of a terminal intended for surface mounting on a circuit board. Thus, they are not suitable as an alternative to a linear light source placed in the air like a metal filament.

SUMMARY OF THE INVENTION

To overcome the foregoing advantage, it is an object of the present invention to provide a light-emitting device suitable as an alternative to a linear light source that is placed in the air like a filament and a lighting apparatus incorporating such a light-emitting device. It is another object of the invention to provide a light-emitting device that decreases light directivity and that easily extracts light in all directions.

A light-emitting device according to a first aspect of the present invention includes: an elongated bar-shaped package extending sideways, the package being formed such that a plurality of leads are formed integrally with a first resin with part of the leads exposed; a light-emitting element that is fixed onto at least one of the leads and that is electrically connected to at least one of the leads; and a second resin sealing the light-emitting element. In the light-emitting device, the first resin and the second resin are formed of optically transparent resin, and the leads have outer lead portions used for external connection and protruding sideways from both left and right ends of the package.

With the light-emitting device of the first aspect of the invention, since, as described above, the first and second resins are fanned of optically transparent resin, it is possible to make both the resins function as light guiding members. Thus, it is possible to guide light toward the back side of the lead on which light-emitting diodes are arranged. Since the bar-shaped package is used, linear light can be generated. Moreover, since outer lead portions used for external connection protrude sideways from both left and right ends of the package, it is possible to increase workability when adjacent ones of the light-emitting device are firmly attached such as by welding.

In the light-emitting device of the first aspect of the invention, the second resin may include fluorescent material. Thus, it is possible to change the color of light emitted from the light-emitting device with the fluorescent material included in the second resin.

A lighting apparatus according to a second aspect of the invention includes: a plurality of the light-emitting devices of the first aspect; a filament including the light-emitting devices; and power supply leads electrically connected to the filament. In the lighting apparatus, the filament is so configured that adjacent ones of outer lead portions are firmly attached and connected in series such that adjacent ones of the light-emitting devices are V-shaped, and both ends of the outer lead portions connected in series are firmly attached to the power supply leads.

Since, in the lighting apparatus of the second aspect of the invention, as described above, adjacent ones of the outer lead portions are firmly attached and connected in series such that adjacent ones of the bar-shaped light-emitting devices are V-shaped, the lighting apparatus can take the same form of light emission as a metal filament. Moreover, since the bar-shaped light-emitting devices are formed of optically transparent resin, it is possible to provide a lighting apparatus that can extract light not only in directions toward the front and back of the leads but also in directions in which the outer lead portions used for external connection extend and that evenly emits light 360 degrees, that is, in all directions.

As described above, according to the present invention, it is possible to provide light-emitting devices that can extract light over a wide area and that have wide directivity and a lighting apparatus incorporating such light-emitting devices. It is also possible to provide light-emitting devices in which adjacent ones of the light-emitting devices are firmly attached with ease.

DETAILED DESCRIPTION OF PREFERRED EMBODIMENTS

Figure 1:
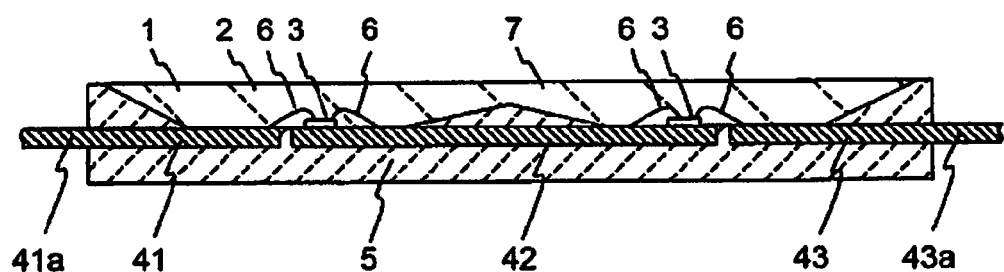
FIG. 1 is a cross-sectional view taken along a lengthwise direction of a light-emitting device according to an embodiment of the present invention.
Figure 2:
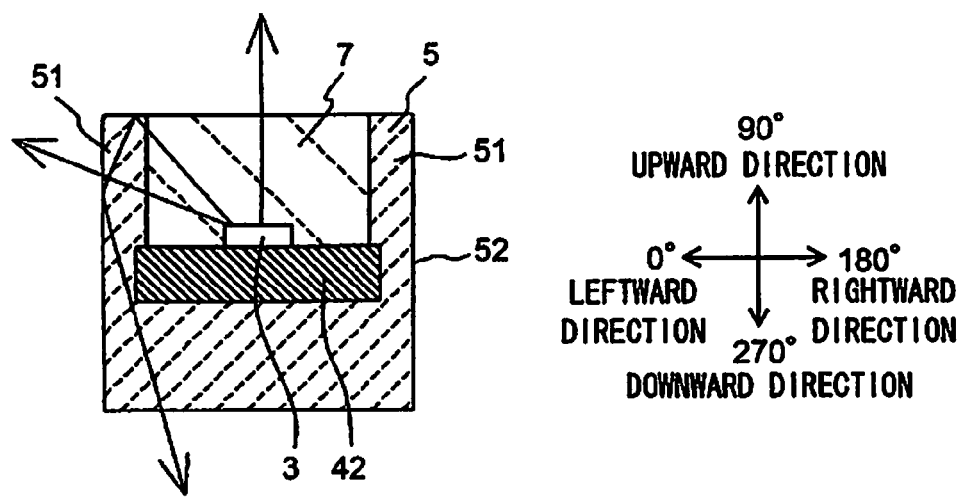
FIG. 2 is a cross-sectional view taken along a widthwise direction of the light-emitting device according to the embodiment of the invention.

Embodiments of the present invention will be described below with reference to the accompanying drawings. FIG. 1 is a cross-sectional view taken along a lengthwise direction of a light-emitting device according to an embodiment of the invention. FIG. 2 is a cross-sectional view taken along a widthwise direction of the light-emitting device according to the embodiment of the invention. FIG. 1 shows the cross-sectional view taken along line A-A of FIG. 3D; FIG. 2 shows a cross-sectional view taken along line B-B of FIG. 3D.

A light-emitting device 1 is configured such that light-emitting elements 3 are incorporated in a lead-frame type package 2, that these light-emitting elements 3 are sealed with resin and that the light-emitting device 1 is formed overall in the shape of an elongated bar. The package 2 is formed in the shape of an elongated bar extending sideways such that parts of a plurality of leads 41, 42 and 43 formed with a lead frame 4 are exposed and that the leads 41, 42 and 43 are formed integrally with a first resin 5. The light-emitting elements 3 are fixed on at least one of the leads 41, 42 and 43 with adhesive material. The light-emitting elements 3 are electrically connected to at least one of the leads 41, 42 and 43 by bonding wires 6. In this embodiment, a lead on which the light-emitting elements are fixed is wired, by bonding wires 6, to the other leads adjacent to the lead mentioned previously. Although the above description discusses the case where the number of light-emitting elements incorporated in the package is two, the number of light-emitting elements is not limited to this number. The number of light-emitting elements is arbitrarily determined according to the shape of the light-emitting device 1. The light-emitting elements 3 incorporated in the package 2 are sealed with a second resin 7 different from the first resin 5. As the light-emitting elements 3, light-emitting elements composed of, for example, light-emitting diodes can be used.

A method of fabricating the light-emitting device 1 will be described below in detail with reference to a fabrication process shown in FIGS. 3A to 3D.

Figure 3A:
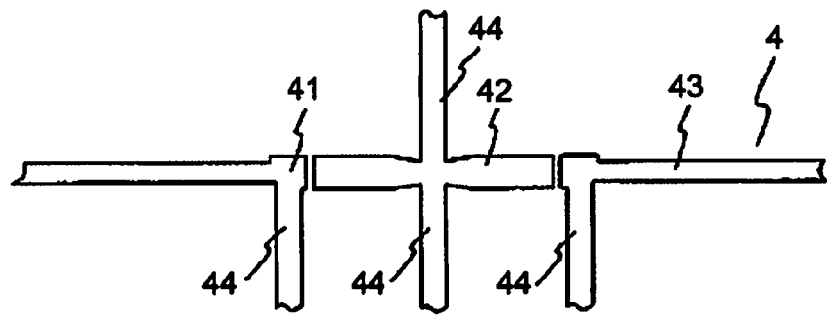
FIG. 3A is a diagram showing a process of fabricating the light-emitting device according to the embodiment of the invention.

First, as shown in FIG. 3A, the lead frame in which a plurality of leads 41, 42 and 43 are connected by tie bars 44 is prepared. This lead frame is formed of metal material such as iron-based material or copper-based material. The leads 41, 42 and 43 are connected to a main frame (not shown) through the tie bars 44. Although the leads for one light-emitting device 1 are only shown in FIG. 3A, leads for a plurality of light-emitting devices are actually connected to the main frame (not shown) through the tie bars 44.

Figure 3B:
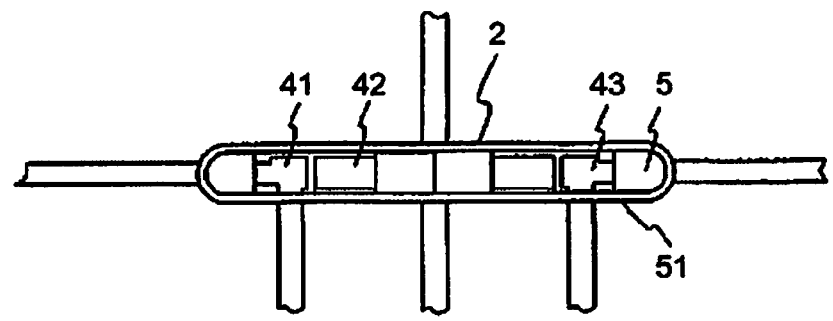
FIG. 3B is another diagram showing the process of fabricating the light-emitting device according to the embodiment of the invention.

As shown in FIG. 3B, the first resin 5 is then molded onto the lead frame by, for example, insert molding. The first resin 5 is formed of optically transparent resin; a highly heat-resistant transparent resin obtained by including glass components in, for example, Nylon (a registered trademark) can be used as the first resin 5. The leads 41, 42 and 43 are formed integrally with the first resin 5 such that parts of the upper surfaces thereof are held exposed from the first resin 5. The first resin 5 is integrally molded such that side walls 51 higher than the upper surfaces of the leads 41, 42 and 43 are formed along the outer circumference of the upper surface of the first resin 5. The side walls 51 have the function of appropriately forming the appearance shape of the second resin 7 when it is molded. In this way, a rein-frame type package 2 is formed with the lead frame.

Figure 3C:
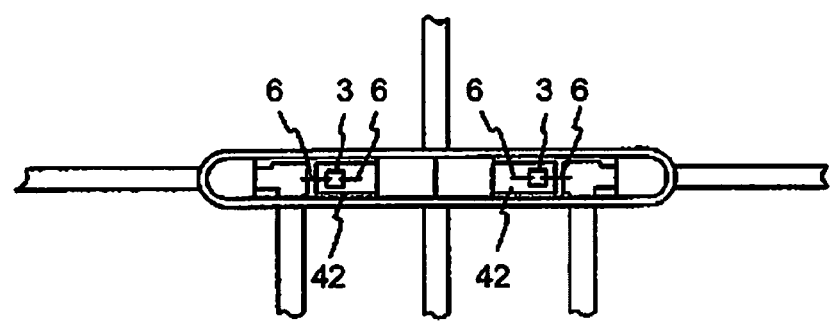
FIG. 3C is another diagram showing the process of fabricating the light-emitting device according to the embodiment of the invention.

As shown in FIG. 3C, the light-emitting elements 3 are then fixed onto the upper surface of the lead 42 with adhesive material. In this embodiment, the light-emitting elements 3 are used in which both their positive and negative electrodes are arranged on their upper surfaces. Thus, the backs of the light-emitting elements 3 are fixed onto the lead with insulating adhesive material. After the light-emitting elements 3 are fixed, the light-emitting elements 3 are electrically connected. In this embodiment, ones of the positive and negative electrodes of the light-emitting elements 3 are connected, by the bonding wires 6, to the lead 42, on which the light-emitting elements 3 are fixed; the others of the positive and negative electrodes of the light-emitting elements 3 are connected, by the bonding wires 6, to the leads 41 and 43 other than the lead 42, on which the light-emitting elements 3 are fixed.

Figure 3D:
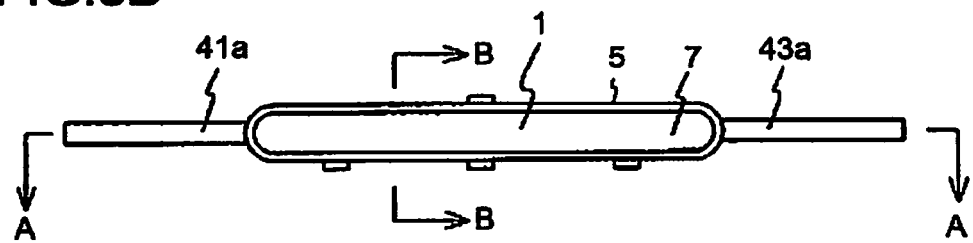
FIG. 3D is another diagram showing the process of fabricating the light-emitting device according to the embodiment of the invention.

Then, as shown in FIG. 3D, the light-emitting elements 3 and the bonding wires 6 are sealed together with the second resin 7. An optically transparent resin or an epoxy resin can be used as the second resin 7. Since the second resin 7 is arranged to come into contact with the first resin 5, in order to prevent the first resin 5 from melting and deforming when the second resin 7 is molded, a resin whose curing temperature is less than the upper temperature limit of the first resin 5 is used as the second resin 7. Although an optically transparent resin or an epoxy resin can be used alone as the second resin 7, in this embodiment, a resin is used that contains a fluorescent material (not shown) varying the wavelength of light emitted from the light-emitting element 3 and emitting it. In a case where a light-emitting element that emits blue light is used as the light-emitting element 3, when a fluorescent material is used that receives the blue light and emits yellowish light, whitish light (including white light) is extracted as a result of both the light being mixed. When a fluorescent material is used that can emit light having a large number of reddish components, it is possible to emit light having a number of reddish components like light of daylight color (color of light emitted from a light bulb).

As a fluorescent material is arranged further away from the light-emitting elements 3, it becomes less likely that the fluorescent material is excited by light emitted from the light-emitting elements 3. This causes inconsistencies in color, and thus the fluorescent material is preferably concentrated and arranged near the light-emitting elements so that inconsistencies in color are prevented. For example, by using a fluorescent material having a larger specific gravity than that of the second resin 7, it is possible to deposit the fluorescent material on the bottom of the second resin 7 and thus concentrate and arrange the fluorescent material near the light-emitting elements 3.

The second resin 7 and the first resin 5 are molded separately as described above, and this eliminates the need to take into account whether or not the first resin 5 is suitable for the fluorescent material when the resin and material are selected. Thus, when the resin and material are selected, it is less likely to undergo restrictions from the first resin 5. This helps design the arrangement of the fluorescent material in an optimum position.

As shown in FIG. 2, the second resin 7 is filled to the top of the frame formed by the side walls 51 of the first resin 5. Alternatively, it is possible to place the second resin 7 only in the vicinity of the light-emitting elements 3 such that the second resin 7 covers the light-emitting elements 3.

After the second resin 7 is cured, the leads 41 and 43 are cut such that portions serving as outer lead portions 41a and 43a used for external connection are left, and the tie bars 44 are cut near the side walls 51. Thus, the light-emitting devices 1 are individually completed by being separated from the lead frame.

In the light-emitting device 1 thus completed, when a predetermined voltage is applied between the outer lead portions 41a and 43a protruding sideways from the side walls 51 of the first resin 5, a predetermined current is fed to the light-emitting elements 3, and this allows them to be turned on. Part of light emitted from the light-emitting element 3 excites the fluorescent material. As shown by arrows of FIG. 2, light emanating from the fluorescent material and the light emitted from the light-emitting element 3 are directed to the upper surface of the device but part thereof is directed through the optically transparent first resin 5 and the second resin 7 to the back side of the leads 41, 42 and 43. In this way, light is also extracted from the back side of the light-emitting device. Here, in order to direct a larger amount of light to the back side of the leads 41, 42 and 43, it is preferable to mold the first resin 5 such that it covers more of the backs of the leads 41, 42 and 43. Thus, in order to prevent the backs of the leads 41, 42 and 43 from being exposed, it is preferable to cover the entire backs with the first resin in the light-emitting device 1. In this way, it is possible to increase the amount of light extracted from the backs. This is preferable so that wide directivity is achieved.

Figure 4A:
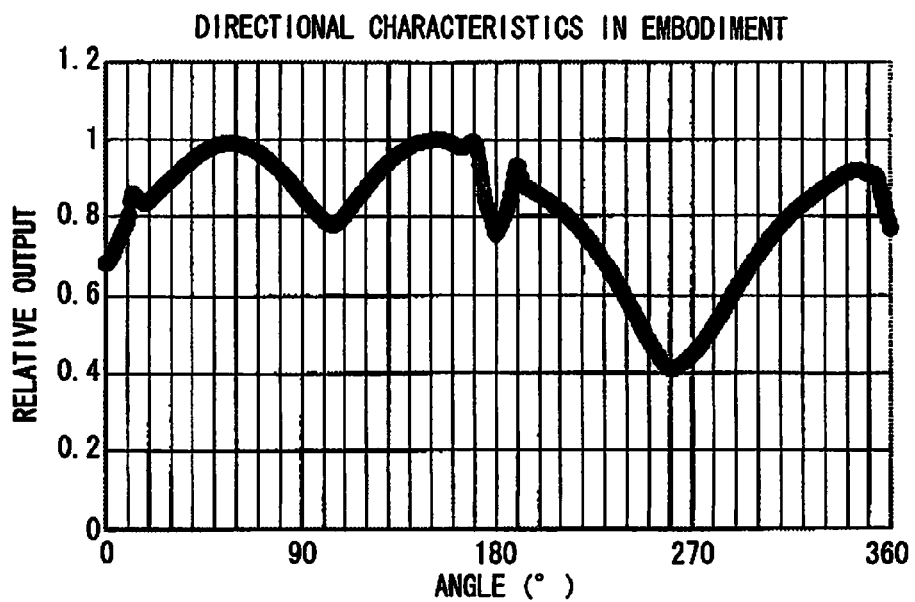
FIG. 4A shows the directional characteristics of the light-emitting device according to the embodiment of the invention.
Figure 4B:
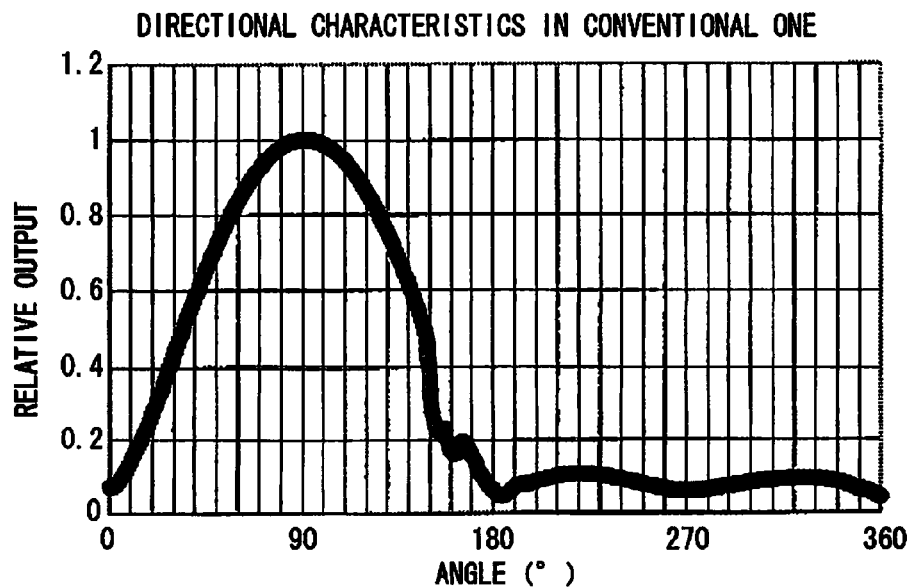
FIG. 4B shows the directional characteristics of an example of a conventional light-emitting device.

FIGS. 4A and 4B show the distributions of the relative outputs of light-emitting devices in upward, downward, leftward and rightward directions. As shown in FIG. 2, an angle of 0° (360°) indicates the leftward direction with respect to the device 1, an angle of 90° indicates the upward (frontward) direction with respect to the device 1, an angle of 180° indicates the rightward direction with respect to the device 1 and an angle of 270° indicates the downward (backward) direction with respect to the device 1. FIG. 4A shows the distribution of the relative output in the above-described embodiment; FIG. 4B shows the distribution of the relative output in an example of a conventional light-emitting device where an optically reflective white resin is used as the first resin. A comparison of the above-described embodiment and the example of the conventional light-emitting device with reference to FIGS. 4A and 4B shows that the relative amount of light in the direction of an angle of 270° (in the backward direction) is significantly increased from 0.1 in the case of the example of the conventional one to 0.4 in the case of the above-described embodiment. Thus, according to the above-described embodiment, it is possible to emit light in all directions instead of one direction. This makes it possible to achieve wide directivity.

Figure 5:
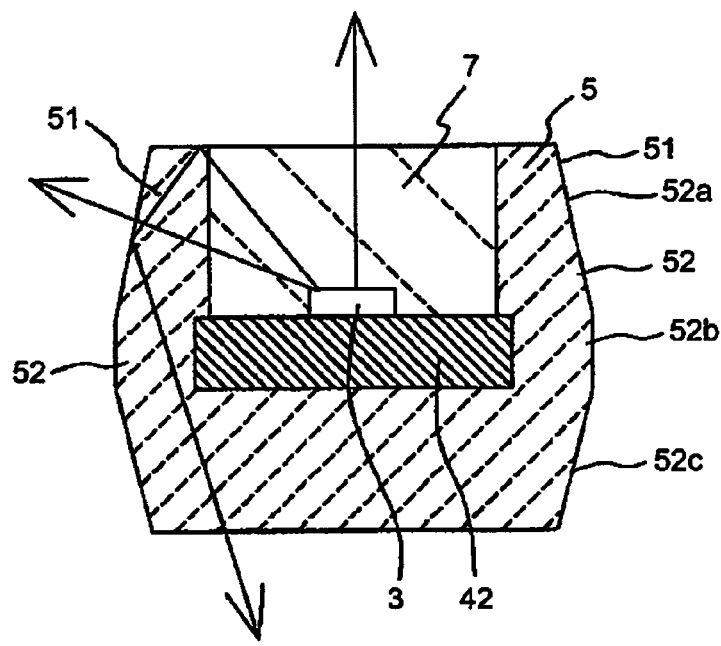
FIG. 5 is a cross-sectional view taken along a widthwise direction of a light-emitting device according to another embodiment of the invention.
Figure 6:
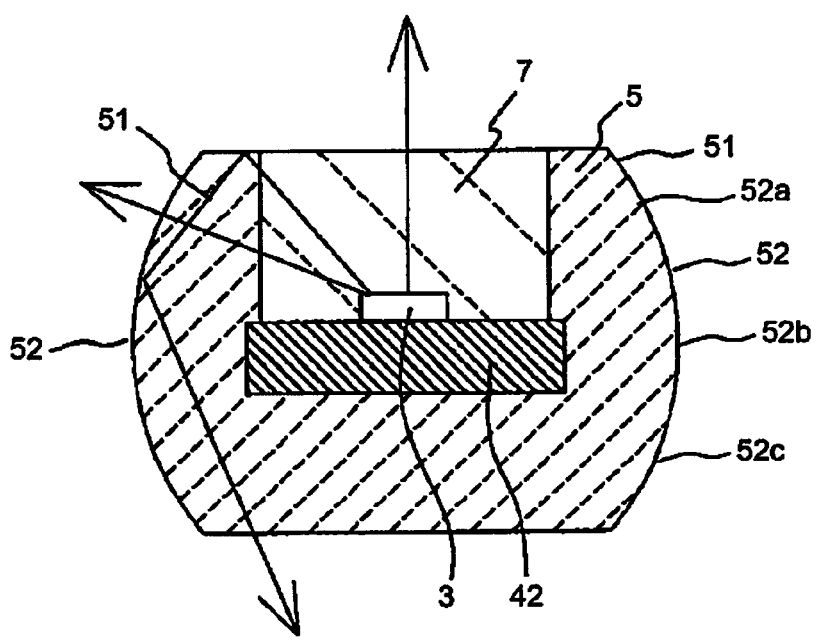
FIG. 6 is a cross-sectional view taken along a widthwise direction of a light-emitting device according to yet another embodiment of the invention.

FIGS. 5 and 6 show different embodiments of the present invention. These embodiments differ from the previously described embodiment in that the side surfaces 52 of the first resin 5 located on the left and right sides of the light-emitting elements are designed such that the middle portions thereof in an up/down direction extend outward and that the upper outside surfaces of the side walls 51 extend outward in left and right directions as they extend from top and bottom.

In the embodiment shown in FIG. 5, when the side surfaces 52 of the first resin 5 are designed such that the middle portions thereof in an up/down direction extend outward, they are designed such that the outlines of top, middle and bottom portions 52a, 52b and 52c are composed of connected straight lines. In the embodiment shown in FIG. 6, when the side surfaces 52 of the first resin 5 are designed such that the middle portions thereof in an up/down direction extend outward, they are designed such that the outlines of the top, middle and bottom portions 52a, 52b and 52c are composed of connected arc-shaped curves.

As described above, the side surfaces are designed such that the middle portions thereof in an up/down direction extend outward, and thus, by adjusting the critical angle of outgoing light from the side surfaces, it is possible to effectively guide, toward the backs, light that passes through the side surfaces and emanates sideways. This makes it possible to increase the relative amount of light directed toward the backs. The light from the light-emitting device 1 is guided not only toward the backs of the leads 41, 42 and 43 but also toward the outer lead portions 41a and 43a through the first and second resins 5 and 7.

The light-emitting device 1 described above can be used as a light source that serves as the filament of a light bulb and that is an example of a lighting apparatus.

Figure 7:
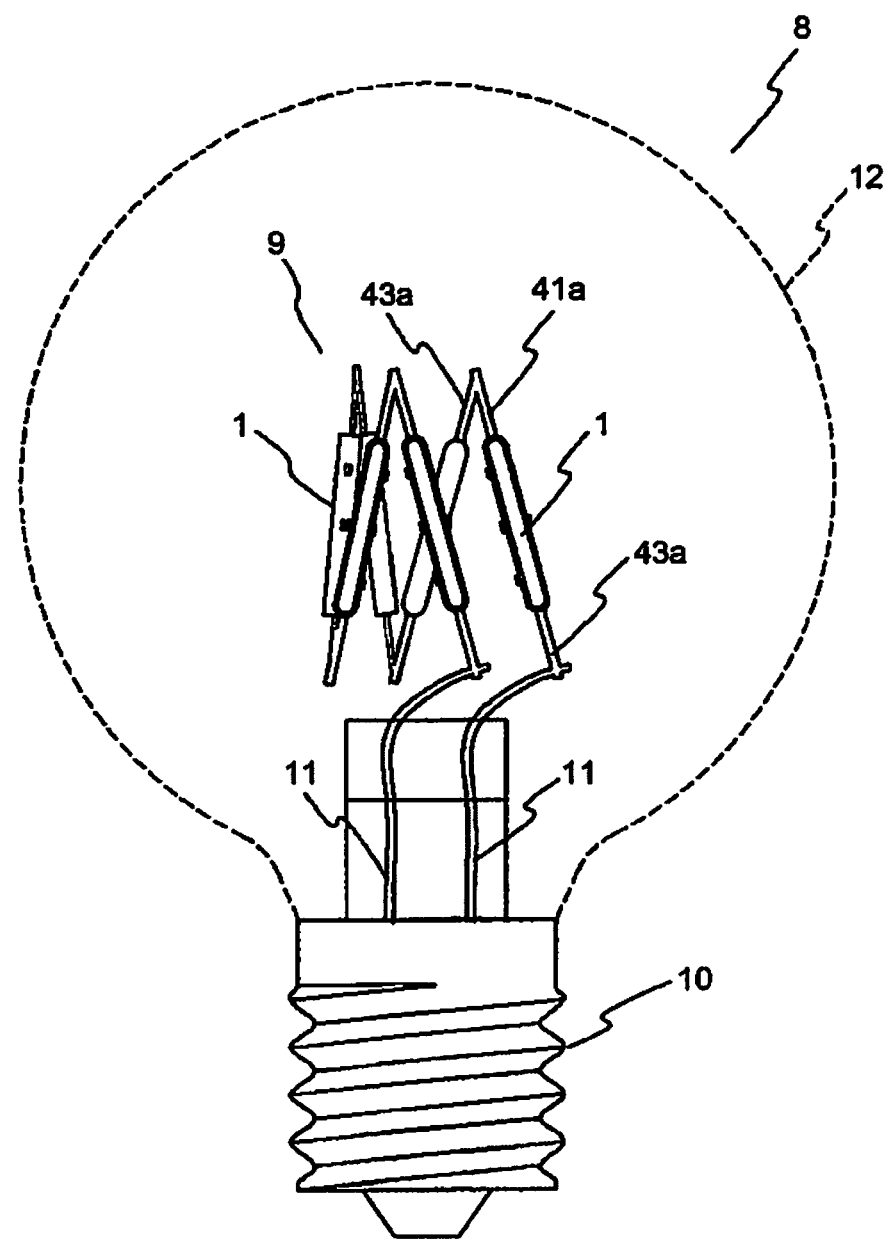
FIG. 7 is a front view of a light bulb according to still yet another embodiment of the invention, with its glass cover omitted.

FIG. 7 shows a front view of an LED (light-emitting diode) light bulb that uses the above-described light-emitting devices as a filament and that is an example of a lighting apparatus, with some parts omitted. With reference to FIG. 7, a description will be given of an LED light bulb 8, that is, a lighting apparatus according to an embodiment of the present invention.

The LED light bulb 8 includes, in its base 10 hermetically sealing the opening of a glass cover 12, a control board (not shown) that converts commercial electric power into electric power for driving the LEDs. A filament 9 is firmly attached to a pair of power supply leads 11 extending from the control board. The internal space of the light bulb 8 is filled with an inert gas such as nitrogen, which excludes oxygen.

The filament 9 is formed with a plurality of the light-emitting devices 1. In this embodiment, adjacent ones of the outer lead portions 41a and 43a are firmly attached to each other by welding such that the six of the light-emitting devices 1 are connected in series. Both ends of a component obtained by connecting the light-emitting devices 1 in series are firmly attached by welding to the pair of power supply leads 11. A pair of the light-emitting devices 1 connected to the pair of power supply leads 11 are arranged in parallel; the other light-emitting devices 1 other than them are arranged such that adjacent ones of the light-emitting devices 1 are V-shaped, that is, zigzag-shaped.

When the light bulb 8 configured as described above is fitted into an unillustrated socket, commercial electric power is applied to the base 10, the integral control board performs power conversion and thus a predetermined direct current is fed to the leads 11. The predetermined direct current is fed to the filament 9 through the leads 11, and thus the predetermined current is passed through the individual light-emitting devices 1 of the filament 9. In the light-emitting devices 1, the light-emitting elements 3 emit light as a result of the predetermined current being fed, and the emitted light passes through the resins 5 and 7 to illuminate the surrounding area. Since, as described above, bar-shaped light-emitting devices 1 are arranged in a zigzag manner and thus the filament 9 is shaped similar to a metal filament, it is possible to take the same form of light emission as a common incandescent light bulb. Specifically, for example, when a plurality of light-emitting diodes are fitted directly to the control board, interception of light by the control board or the like results in narrow directivity; however, with the lighting apparatus of this embodiment, it is possible to achieve wide directivity as in an incandescent light bulb incorporating a metal filament.

Since the light-emitting devices 1 themselves have such wide directivity that they can emit light in all directions, it is possible to increase the degree of freedom to arrange the light-emitting devices 1 when the outer lead portion 41*a* of the light-emitting device 1 is firmly attached such as by welding to the outer lead portion 43*a* of the adjacent light-emitting device 1. Moreover, since light can also be extracted from both the left and right ends of the light-emitting device 1, more light can be guided toward the top of the cover 12 located on the opposite side from the base 10 of the light bulb 8. Here, a transparent glass cover may be used as the glass cover 12 or a glass cover whose inner surface is subjected to light-scattering treatment and whose color is of milky white may be used as the glass cover 12.

The present invention is not limited to the above embodiments. Many modifications and variations are possible without departing from the spirit of the invention.

The present invention can be applied to a light-emitting device for emitting light from a light-emitting element over a wide area and to a lighting apparatus incorporating such a light-emitting device.

What is claimed is:

1. A light-emitting device comprising:
   an optically transparent first resin that is an elongated resin frame type including a side wall;
   a metal lead that is arranged along a lengthwise direction within the resin frame;
   a plurality of light-emitting diodes that are placed on the metal lead;
   outer leads that protrude outwardly from both ends of the first resin and that are electrically connected to the light-emitting diodes; and
   an optically transparent second resin that fills in the resin frame so as to cover the metal lead and the light-emitting diodes.

2. The light-emitting device of claim 1,
   wherein the second resin contains a fluorescent material.

3. The light-emitting device of claim 2,
   wherein the side wall is formed so as to be higher than an upper surface of the metal lead, and part of light emitted from the light-emitting diodes and entering the side wall and part of light emitted from the fluorescent material and entering the side wall are transmitted to the resin frame on a back side of a lower surface of the metal lead.

4. The light-emitting device of claim 3,
   wherein the light-emitting diodes output blue light, and the fluorescent material receives the blue light to emit yellowish light.

5. The light-emitting device of claim 1,
   wherein the light-emitting diodes are placed on the metal lead with an insulating adhesive material.

6. The light-emitting device of claim 1,
   wherein lower surfaces of the light-emitting diodes are placed on the metal lead, and bonding wires are connected to upper surfaces of the light-emitting diodes.

7. A light-emitting device comprising:
   a plurality of light-emitting elements that are fixed on a metal lead;
   a first resin that includes a side wall and that is frame-shaped to surround the metal lead; and
   a second resin that covers the light-emitting elements and the metal lead,
   wherein the first resin is formed of a resin containing an optically transparent glass component,
   the second resin is formed of an optically transparent silicon resin or epoxy resin and
   outer leads for external connection are electrically connected to the light-emitting elements, and protrude from both ends of the first resin.

8. The light-emitting device of claim 7,
   wherein the first resin is formed in a shape of an elongated resin frame type-,
   the second resin contains a fluorescent material and
   the side wall is formed so as to be higher than an upper surface of the metal lead, and part of light emitted from the light-emitting elements and entering the side wall and part of light emitted from the fluorescent material and entering the side wall are transmitted to the resin frame on a back side of a lower surface of the metal lead.

9. The light-emitting device of claim 7,
   wherein the light-emitting elements are fixed on the metal lead with an insulating adhesive material.

10. The light-emitting device of claim 7,
    wherein lower surfaces of the light-emitting elements are fixed on the metal lead, and bonding wires are connected to upper surfaces of the light-emitting elements.

* * * * *